United States Patent
Miyaaki et al.

(10) Patent No.: US 7,413,458 B2
(45) Date of Patent: Aug. 19, 2008

(54) SOCKET FOR ELECTRICAL PARTS

(75) Inventors: Junichi Miyaaki, Saitama (JP);
Tadayuki Okamoto, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 11/773,159

(22) Filed: Jul. 3, 2007

(65) Prior Publication Data
US 2008/0009168 A1     Jan. 10, 2008

(30) Foreign Application Priority Data

Jul. 7, 2006  (JP) .............................. 2006-188499
Aug. 7, 2006  (JP) .............................. 2006-214431

(51) Int. Cl.
*H01R 13/62* (2006.01)
(52) U.S. Cl. ..................................... 439/331
(58) Field of Classification Search ................. 439/73, 439/266, 268, 330, 331, 342
See application file for complete search history.

(56) References Cited

U.S. PATENT DOCUMENTS 7,204,708 B2 *   4/2007   Sato et al.   ................... 439/259
7,210,953 B2 *   5/2007   Hayakawa   ................... 439/331
7,214,084 B2 *   5/2007   Hayakawa   ................... 439/331
7,275,938 B2 *   10/2007  Nakano et al.   ................. 439/71

FOREIGN PATENT DOCUMENTS

JP        11-26127         1/1999

* cited by examiner

*Primary Examiner*—Khiem Nguyen
(74) *Attorney, Agent, or Firm*—Staas & Halsey LLP (57) ABSTRACT

In a socket for electrical parts of the present invention, a fixed contact piece—a counterpart to the movable contact piece—is formed on a contact pin arranged on the socket body, a fixed-side contact portion which is designed to contact a lower side of the IC lead of the IC package is formed on the fixed contact piece, while a plurality of slits vertically penetrating a mold guide is formed spaced apart with a predetermined distance and the movable-side contact portions are inserted into slits respectively in order for an upper edge portion of the movable-side contact portion to be faced upward.

3 Claims, 13 Drawing Sheets

PRIOR ART

SOCKET FOR ELECTRICAL PARTS

BACKGROUND OF THE INVENTION

1. Field of the Invention

The present invention relates to a socket for an electrical part for detachably accommodating and holding an electrical parts such as a semiconductor device (what is called an "IC package" hereinafter) and more precisely to a socket for an electrical part capable of preventing a mold guide for guiding the electrical part from being damaged.

2. Prior Art of the Invention

Figure 13:
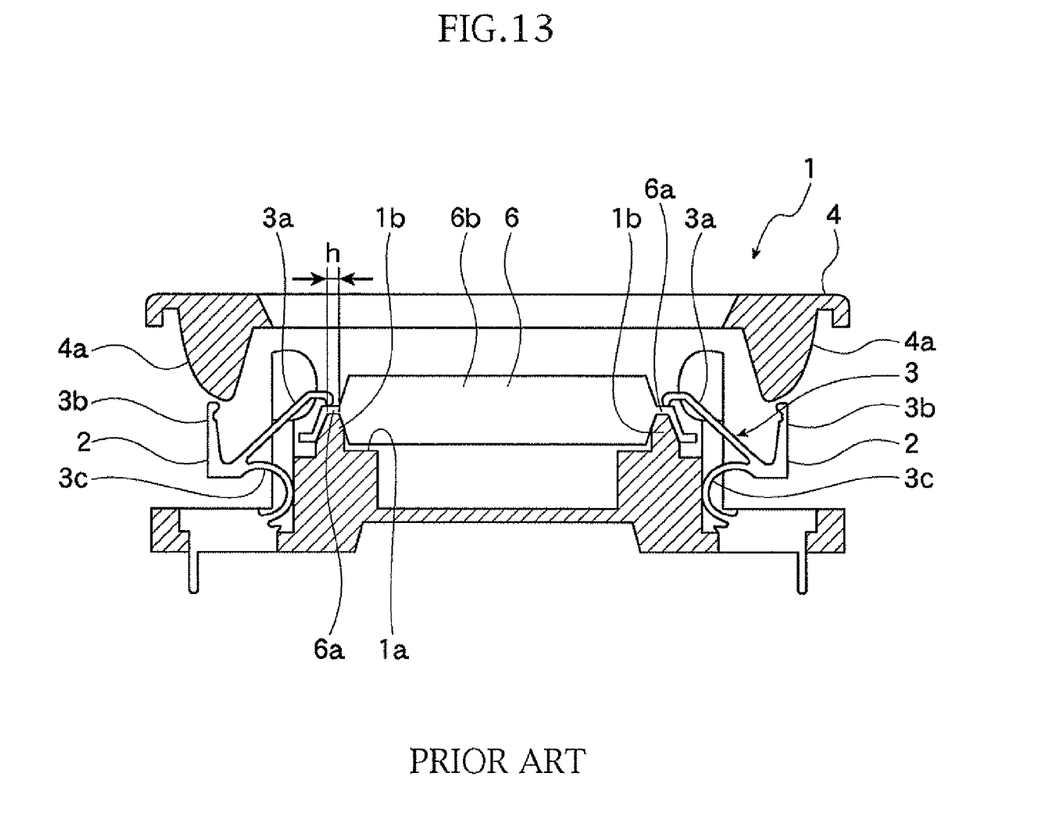
FIG. 13 is a sectional view of a conventional IC socket.

As a conventional "socket for an electrical part" of this kind, there has been provided an IC socket for detachably accommodating and holding an IC package as an "electrical part" (refer to FIG. 13).

This IC package 6 is generally called as a "gullwing type" having a rectangular-shaped package body 6b, from two sides opposite to each other of which a plurality of IC leads 6a as "terminals" project laterally to form into a crank shape.

The IC socket, on the other hand, includes a socket body 1 in which an accommodation portion 1a for accommodating the IC package 6 is provided, and a plurality of contact pins 2 contacting the IC lead 6a of the IC package 6. This contact pin 2 has a movable contact piece 3 having a movable-side contact portion 3a contacting with or separating from an upper surface of the IC lead 6a. On the socket body 1, a mold guide 1b for guiding a periphery of the IC package 6 and supporting a lower surface of the IC lead 6a is formed. In addition, the socket body 1 is further provided with a vertically movable operation member 4. By moving the operation member 4 downward against the urging force etc. of a movable contact piece 3 of the contact pin 2, an operation piece 3b of a movable contact piece 3 of the contact pin 2 is pushed outward by a cam portion 4a of the operation member 4.

Thus a spring portion 3c of the movable contact piece 3 of the contact pin 2 is elastically deformed so that the movable-side contact portion 3a is moved away from the IC lead 6a. On the contrary, when the operation member 4 moves upward, the movable-side contact portion 3a returns back by the elastic force of the spring portion 3c and contacts to the upper surface of the IC lead 6a. And hence the IC lead 6a is clamped by both the movable-side contact portion 3a and the mold guide 1b, thus establishing an electrical connection between the contact pin 2 and the IC lead 6a.

Under a situation that the IC package 6 is not accommodated in the socket body 1 (non-accommodation state), the movable-side contact portion 3a abuts on the mold guide 1b. This mold guide 1b is configured to be relatively narrow so that the mold guide can be inserted into a space (h) between a vertical portion of the crank shaped IC lead 6a and the package body 6b.

A socket of such kind is disclosed, for example, in Patent Document 1 (Japanese unexamined Patent Publication No. H11-26127 A1)

However, in the conventional structure of the socket mentioned above, under a situation that the IC package 6 is not accommodated, an end edge portion of the movable-side contact portion 3a is structured to be landed on the mold guide 1b of the socket body 1. Accordingly, the movable-side contact portion 3a made of metal abuts on the mold guide 1b made of synthetic resin, therefore there is a fear that the mold guide 1b could be damaged.

In addition, when the end edge portion of the movable-side contact portion 3a is somewhat displaced or slid, the end edge portion of the movable-side contact portion 3a is liable to drop off from the end edge portion of the narrow mold guide 1b. When the dropping off occurs, the contact pin 2 itself is likely to be damaged.

SUMMARY OF THE INVENTION

An object of the present invention is to prevent a damage to the mold guide and to provide a socket for an electrical part capable of realizing a good electrical connection between the contact pin and the IC lead of the electrical part.

Another object of the present invention is to prevent a damage to the contact pin by positionally controlling the movable-side contact portion.

Such objects mentioned above can be attained by providing a socket for an electrical part, which comprises:

a socket body into which an electrical part having a terminal extending laterally is accommodated;

a contact pin which is arranged on the socket body and provided with an elastically-deformable and movable contact piece, a movable-side contact portion which is contacted to and separated from an upper surface of the terminal of the electrical part being formed on an end edge portion of the movable contact piece, and a mold guide projected to form a convex shape for guiding a periphery of an electrical part body of the electrical part, wherein a fixed contact piece which is a counterpart to the movable contact piece is formed on the contact pin, a fixed-side contact portion which is designed to contact a lower-side of the electrical part is formed on the fixed contact piece, and a plurality of slits vertically penetrating the mold guide are formed side-by-side at predetermined intervals, and the fixed-side contact portions are inserted into the slits respectively in order for an upper edge portion of the fixed-side contact portion to be faced upward.

In another aspect of the present invention, the upper edge portion of the fixed-side contact portion is projected higher than the upper edge portion of the mold guide.

In still another aspect of the present invention, the terminal of the electrical part projected laterally from the electrical part body is formed into a crank shape, a portion of the terminal near the electrical part body is formed to be a shoulder portion placed one step higher than an end edge portion thereof, the movable-side contact portion is structured to contact an upper surface of the one step higher shoulder portion and the fixed-side contact portion is structured to contact a lower surface of the shoulder portion.

According to the invention mentioned above, when the electrical part is accommodated, the electrical part is guided by the mold guide and accommodated at a predetermined position of the socket body.

In addition, since a plurality of slits are provided in the mold guide and the fixed-side contact portions are inserted into and mounted on the slits respectively, the fixed-side contact portion of the contact pin can be disposed on the mount portion of the mold guide. Accordingly, unlike the conventional sockets, under a situation that the electrical part is not accommodated, the movable-side contact portion does not abut on the mold guide because the fixed-side contact portion is disposed at a place corresponding to the movable-side contact portion. Accordingly, the mold guide made of synthetic resin can be prevented from being damaged. Even if the movable-side contact portion abuts on the fixed-side contact portion, the damage to both portions can be reduced because both portions are made of metal of the same kind.

Further, by inserting the fixed-side contact portion into the slit of the mold guide, the fixed-side contact portion can be guided by the mold guide, and falling down (or toppling) of the fixed-side contact portion can be prevented.

Further, since the fixed-side contact portion of the contact pin is positioned at the mount portion of the mold guide, the terminal of the electrical part can be contacted, in a manner of what is called a two-point contact, with both the movable-side contact portion and the fixed-side contact portion. Accordingly the electrical connection can be improved.

In yet another aspect of the present invention, a socket for an electrical part comprises:

a socket body into which an electrical part having a terminal extending laterally is accommodated; and a contact pin arranged on the socket body and provided with an elastically-deformable and movable contact piece, a movable-side contact portion which is contacted to and separated from an upper surface of the terminal of the electrical part being formed on an end edge portion of the movable contact piece, and under a situation that the electrical part is accommodated, an electrical-part-guide portion is formed on the socket body to support the terminal of the electrical part, both the movable-side contact portion and the upper edge portion of the electrical-part-guide portion are structured to clamp the terminal, wherein the movable contact piece is provided with a position control portion at a portion near the movable-side contact portion, under a situation that the electrical part is not accommodated and the movable contact piece is closed by its elastic force, the position control portion is structured to abut on a stopper portion to thereby positionally control the movable-side contact portion in such a way that the movable-side contact portion is positioned as being apart from the upper edge portion of the electrical part guide portion by a distance less than the thickness of the terminal.

In another aspect of the present invention, a socket for an electrical part comprises:

a socket body into which an electrical part having a terminal extending laterally is accommodated, and a contact pin arranged on the socket body, the contact pin comprises a fixed contact piece, and an elastically-deformable and movable contact piece, a movable-side contact portion, which is structured to contact with and separate from an upper surface of the terminal of the electrical part, being formed on an end edge portion of the movable contact piece, a fixed-side contact portion which contacts a lower surface side of the electrical part terminal when the electrical part is accommodated, is formed on the fixed contact piece, and the terminal is structured to be clamped by both the movable-side contact portion and the fixed-side contact portion, wherein the movable contact piece is provided with a position control portion at a portion near the movable-side contact portion, under a situation that the electrical part is not accommodated and the movable contact piece is closed by its elastic force, the position control portion is structured to abut on a stopper portion to thereby positionally control the movable side contact portion in such a way that the movable-side contact portion is positioned as being apart from the upper edge portion of the fixed-side contact portion by a distance less than the thickness of the terminal.

In another aspect of the present invention, the socket body is provided with the stopper portion.

In another aspect of the present invention, the fixed contact piece is provided with the stopper portion.

According to the other aspects mentioned above, under a situation that the electrical part is not accommodated and the movable contact piece is closed by its elastic force, the position control portion is structured to abut on the stopper portion to thereby positionally control the movable-side contact portion in such a way that the space between the movable-side contact portion and the guide portion of the electrical part or the upper edge portion of the fixed-side contact portion is made narrower than the thickness of the terminal. Accordingly, the movable-side contact portion can be prevented from falling down from the guide portion of the electrical part or the upper edge portion of the fixed-side contact portion, and the contact pin and the guide portion of the electrical part can also be prevented from being damaged.

BRIEF DESCRIPTION OF THE DRAWINGS

In the accompanying drawings:

FIGS. 7A and 7B represent the IC package.

DETAILED DESCRIPTION

Preferred embodiments of the present invention will be described hereunder with reference to the accompanying drawings.

First Embodiment

FIGS. 1 to 7B represent a first embodiment of the present invention.

With reference to FIGS. 1 to 7B, reference numeral 11 is an IC socket as a "socket for an electrical part" for establishing an electrical connection between an IC lead 12b as a "terminal" of an IC package 12 and a circuit board (not shown) of a tester for carrying out a performance test of the IC package 12 as an "electrical part".

Figure 7A:
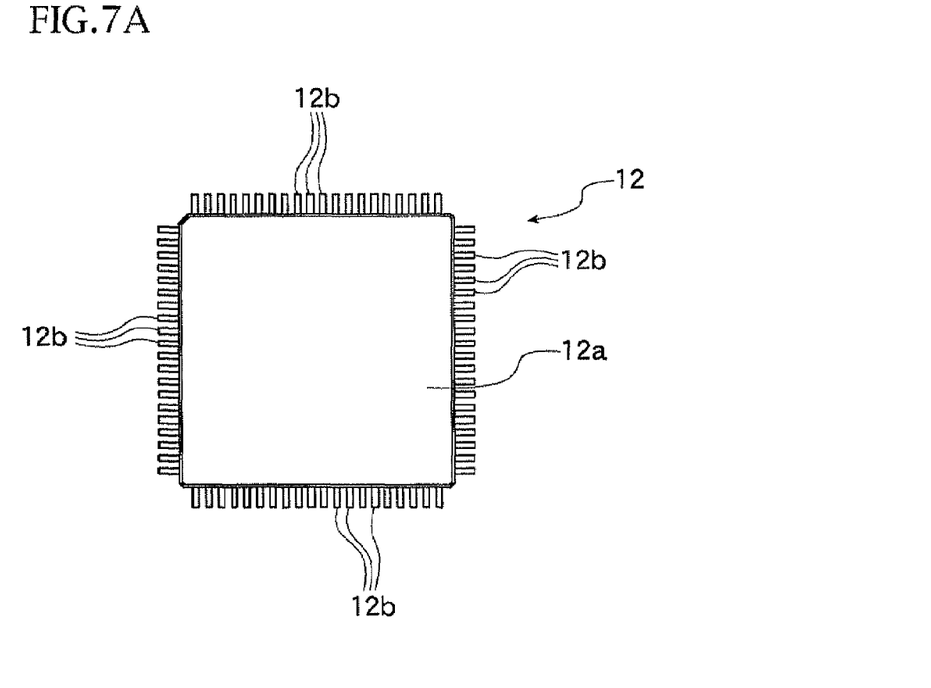
FIG. 7A is a plan view and FIG. 7B is a front view.
Figure 7B:
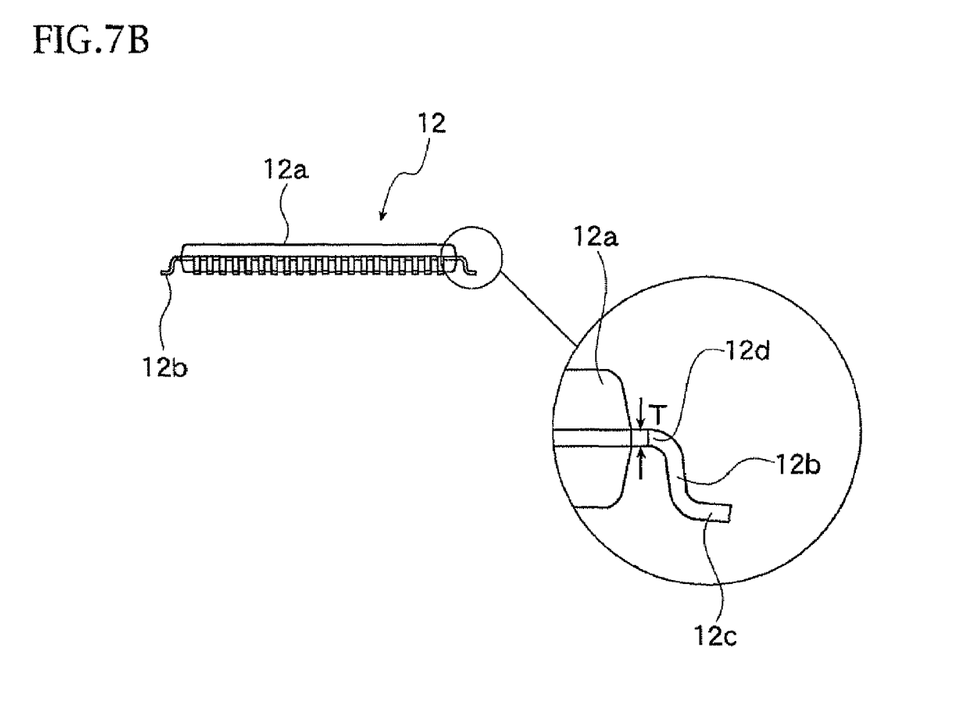
Figure 8:
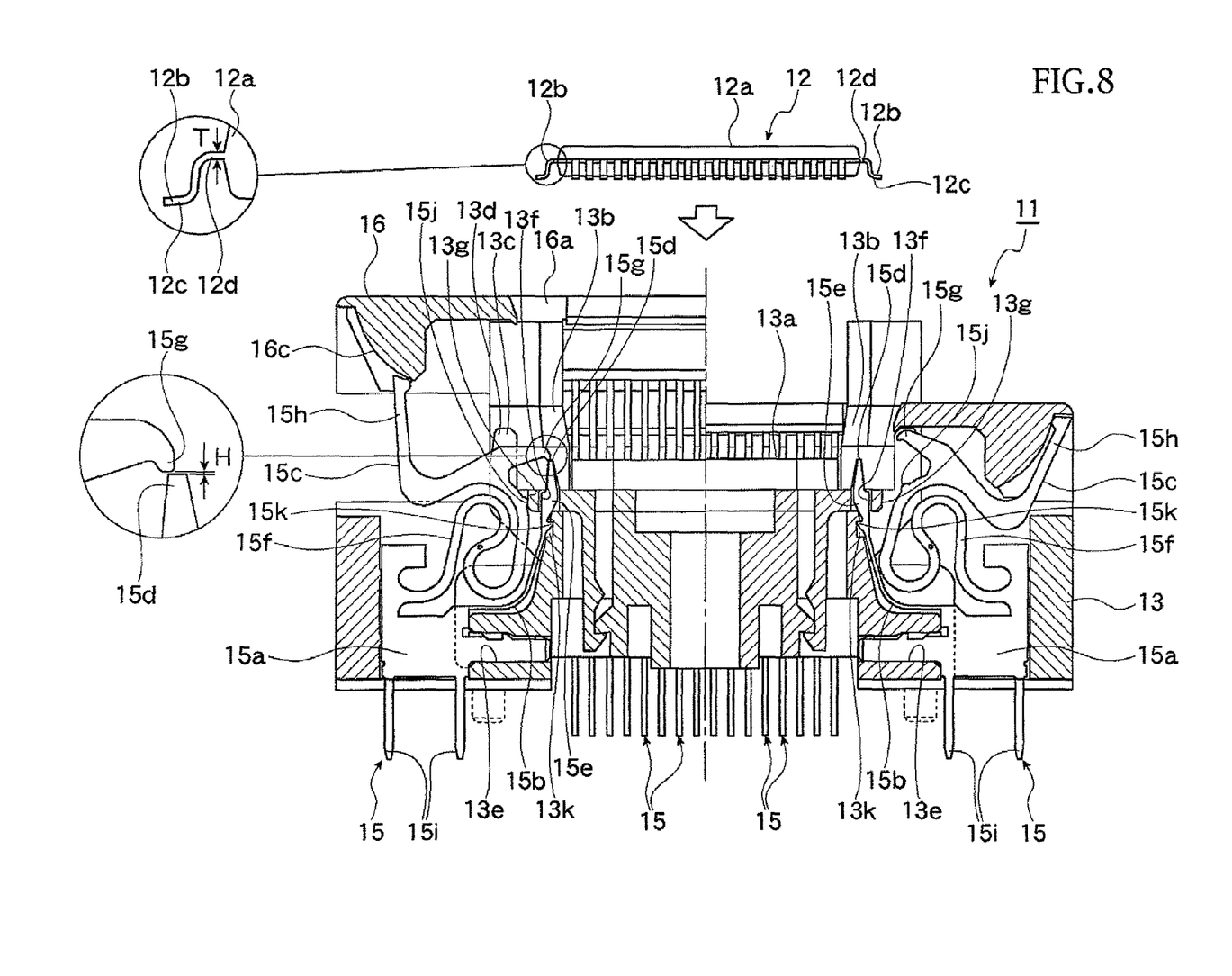
FIG. 8 is a sectional view, corresponding to FIG. 2, of an IC socket according to a second embodiment of the present invention.

The IC package 12, such as shown in FIGS. 7A and 7B, is what is called a gullwing type which has a rectangular shaped package body 12a as a "body of the electrical part" and a plurality of IC leads 12b projecting laterally outward from four sides of the package body. The IC lead 12b is formed into a crank shape, and it has a shoulder portion 12d at a portion near the IC package body 12a and one step higher than an end edge portion 12c thereof.

Figure 1:
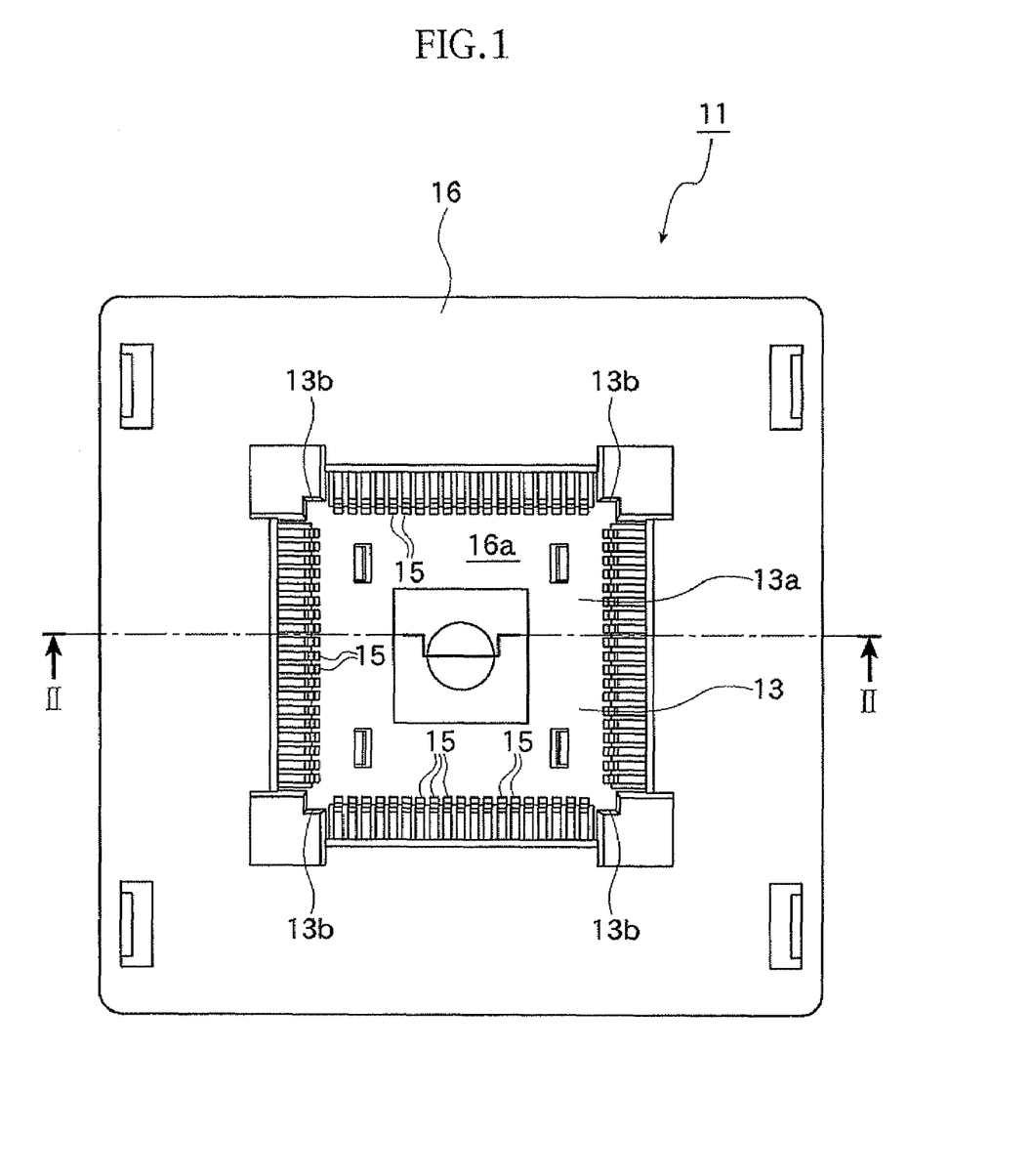
FIG. 1 is a plan view of an IC socket according to a first embodiment of the present invention.
Figure 2:
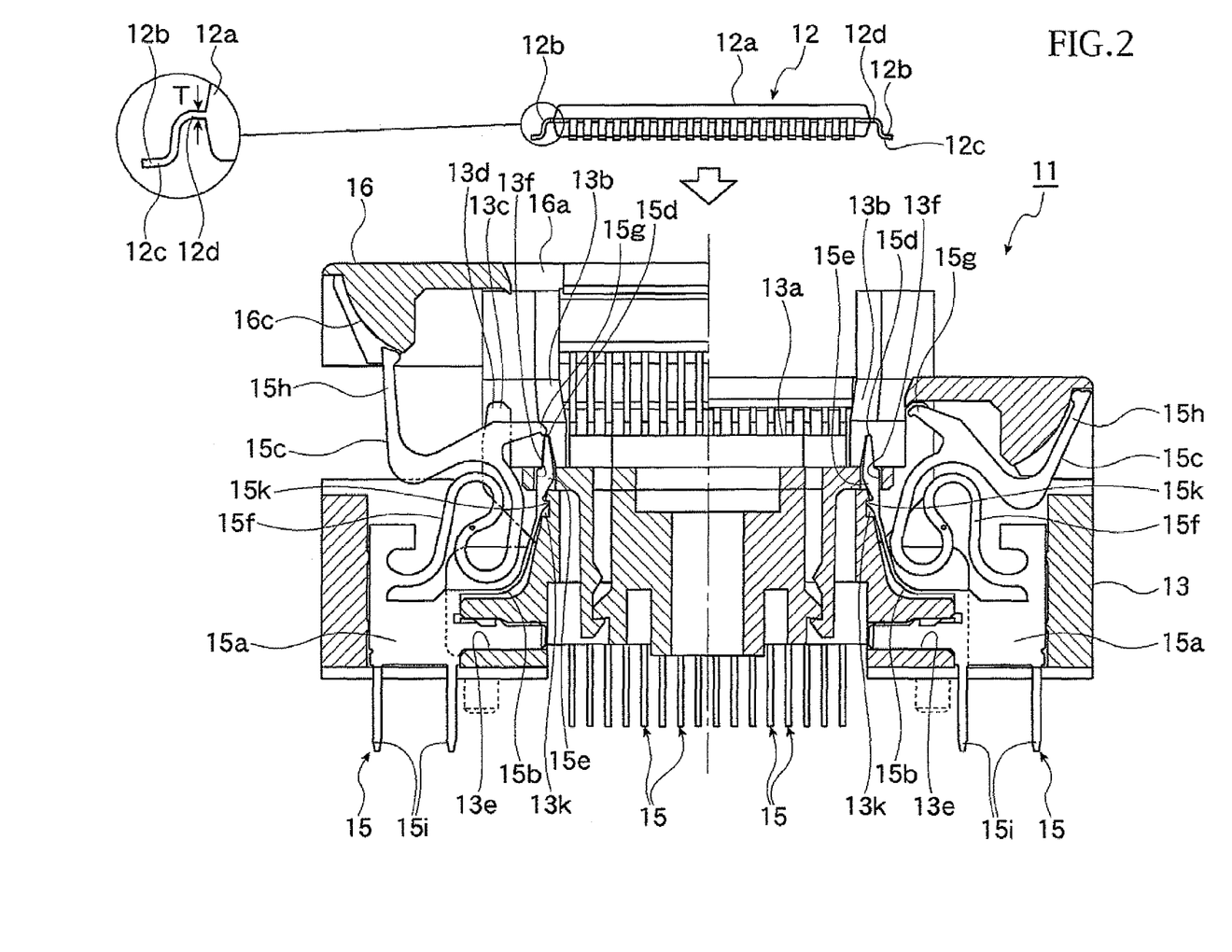
FIG. 2 is a sectional view taken along the line II-II in FIG. 1.
Figure 3:
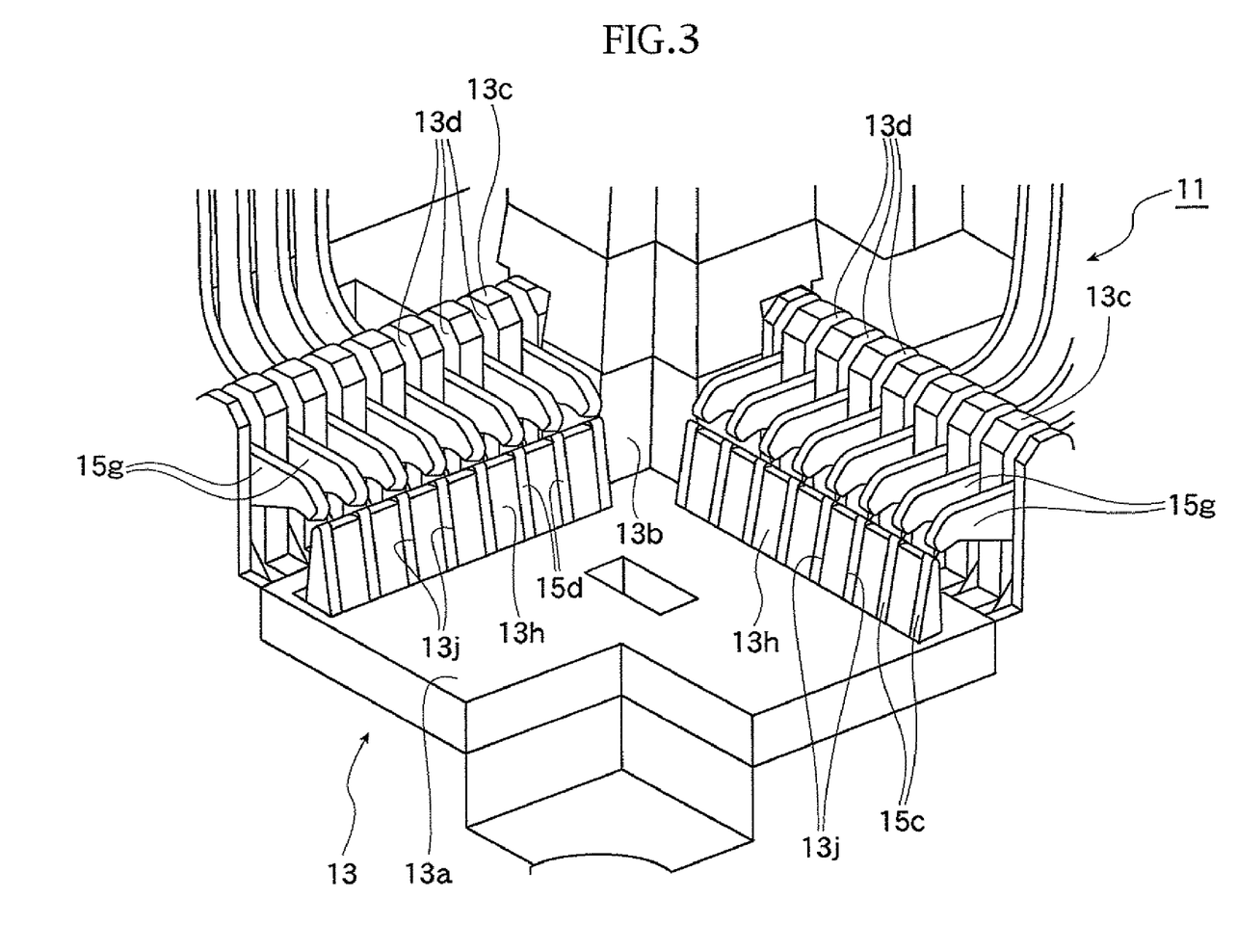
FIG. 3 is a perspective view showing an accommodation portion of the IC socket in FIG. 1.

The IC socket 11, on the other hand, mainly comprises a socket body 13 to be mounted on the circuit board. The socket body 13 has an accommodation portion 13a for accommodating the IC package 12 and guide portions 13b each corresponding to a corner portion of the package body 12a, for positioning the IC package 12 at a predetermined position. Partition wall portions 13c are formed on the four sides between each guide portion on the periphery of the accommodation portion 13a respectively. A plurality of slits 13j are formed side-by-side spaced at predetermined intervals on each partition wall portion 13c. Further, four mold guides 13h for guiding peripheral portion of the package body 12a are formed at inner sides of the four partition wall portions 13c of the socket body 13, respectively.

These mold guides 13h are each formed at a position under the shoulder portion 12d of the crank shaped IC lead 12b. The mold guide 13h projects like a convex or mountainous shape, and a plurality of slits 13j vertically penetrating the mold guide are formed at predetermined intervals (refer to FIG. 3).

In addition, in the socket body 13, a plurality of elastically deformable contact pins 15 contacting with or separating from the IC leads 12b are arranged and a quadrangle-shaped frame-like operation member 16 for elastically deforming these contact pins 15 is vertically and movably disposed.

The contact pin 15 has elasticity and is made of material having an excellent electro conductive property. It is arranged by press-fitting into an outer portion of the accommodation portion 13a of the socket body 13 as shown in FIG. 2.

More precisely, the contact pin 15 is provided with, at a lower side thereof, a fixed portion 15a to be fixed to the socket body 13. The fixed portion 15a is press-fitted into a press-fit opening 13e of the socket body 13. From the fixed portion 15a, a fixed contact piece 15b and a movable contact piece 15c are projected upward. The fixed contact piece 15b and the movable contact piece 15c are paired.

At an upper edge portion of the fixed contact piece 15b, a fixed-side contact portion 15d, which abuts on a lower surface of the IC lead 12b, is formed. As shown in FIG. 2, the fixed-side contact portion 15d has a triangular shape and is inserted into an insertion hole 13f formed in the socket body 13, and an engaging portion 15e is engaged with the socket body 13. Thus a downward movement of the fixed-side contact portion 15d are restricted, and the fixed-side contact portions are each remained inserted in each slit 13j. The upper edge portion of the fixed-side contact portion 15d is faced upward and projects slightly higher than an upper end portion of the mold guide 13h, and a shoulder portion 12d of the IC lead 12b is structured to be placed and abutted on the narrowed upper edge portion of the fixed-side contact portion 15d.

In addition, as shown in FIG. 2, in the vicinity of a lower side of the fixed-side contact portion 15d of the fixed contact piece 15b, an engaging projection 15k is formed. The engaging projection 15k is engaged with an engaged concave portion 13k formed on the socket body 13 and hence the upward movement of the fixed contact piece 15b is restricted.

Approximately S-shaped spring portion 15f is formed on the movable contact piece 15c. From an upper side of the spring portion 15f, the movable-side contact portion 15g is extended toward a center portion of the socket body 13. The movable side contact portion 15g is structured to abut on and press down an upper surface of the shoulder portion 12d of the IC lead 12b in such a manner that the shoulder portion 12d of the IC lead 12b is clamped by both the movable-side contact portion 15g and the fixed-side contact portion 15d of the fixed contact piece 15b.

And the contact pin 15 is provided with an operation piece 15h, which is pushed by the operation member 16 (details will be explained afterward). It branches off the movable-side contact portion 15g and extends upward. Furthermore, there is a lead portion 15i extending downward from a lower side of the fixed portion 15a and connecting the circuit board (not shown).

The operation member 16, on the other hand, is formed into a rectangular frame-like shape corresponding to the shape of the IC package 12 and has an opening 16a large enough to allow the IC package 12 to pass therethrough, to thereby accommodate the IC package 12 on an upper-side of the accommodation portion 13a of the socket body 13. The operation member 16 is disposed vertically movable with respect to the socket body 13 and urged upward by a coil spring (not shown). At its uppermost position, an engaging claw (not shown) engages with an engaged portion of the socket body 13 so that the operation member 16 is prevented from coming off.

Further, the operation member 16 is provided with a cam portion 16c which slides on the operation piece 15h of the contact pin 15. By moving the operation member 16 downward, the operation piece 15h of the contact pin 15 is pushed by the cam portion 16c, so that the spring portion 15f is elastically deformed to cause the movable-side contact portion 15g to be moved obliquely upward and outward.

Next, the function and the operation of such an IC socket 11 of the present invention will be explained hereunder.

Firstly, the lead portion 15i of the contact pin 15 in the IC socket 11 is inserted into the insertion hole of the circuit board and then soldered, so that a plurality of IC sockets 11 are arranged on the circuit board.

Then the IC packages 12 are set as follows and electrically connected with such IC socket 11 using, for example, an automated machine.

More specifically, the IC packages 12 are conveyed by the automated machine to a place above the accommodation portion 13a of the socket body 13. From a state shown in FIG. 4, an operation member is pressed and moved downward against the urging force of the contact pins and the coil spring (not shown) by the automated machine. At this timer the cam portion 16c of the operation member 16 pushes the contact-pin operation piece 15h to cause the spring portion 15f to be elastically deformed, and the movable-side contact portion 15g moves obliquely upward, opens maximally and recedes from an insertion area of the IC package 12.

Under this situation, the automated machine releases the IC package 12. The IC package 12 is guided by the guide portion 13b and is placed on the accommodation portion 13a of the socket body 13. Thus, the shoulder portion 12d of the IC lead 12b of the IC package 12 is contacted with the fixed-side contact portion 15d of the contact pin 15 (refer to FIG. 5).

Next, when the pressing force of the operation member 16 by the automated machine is released, the operation member 16 is moved upward by the elastic force of the spring portion 15f of the movable contact piece 15c of the contact pin 15 and the coil spring, and the movable-side contact portion 15g of the contact pin 15 begins to return toward its original position. When the operation member 16 moves upward to a predetermined position, the movable-side contact portion 15g of the contact pin 15 abuts on an upper surface of the shoulder portion 12d of the IC lead 12b of the IC package 12, establishing an electrical connection (refer to FIG. 6).

Under this state, the IC package 12 is subjected to a burn-in test.

Figure 4:
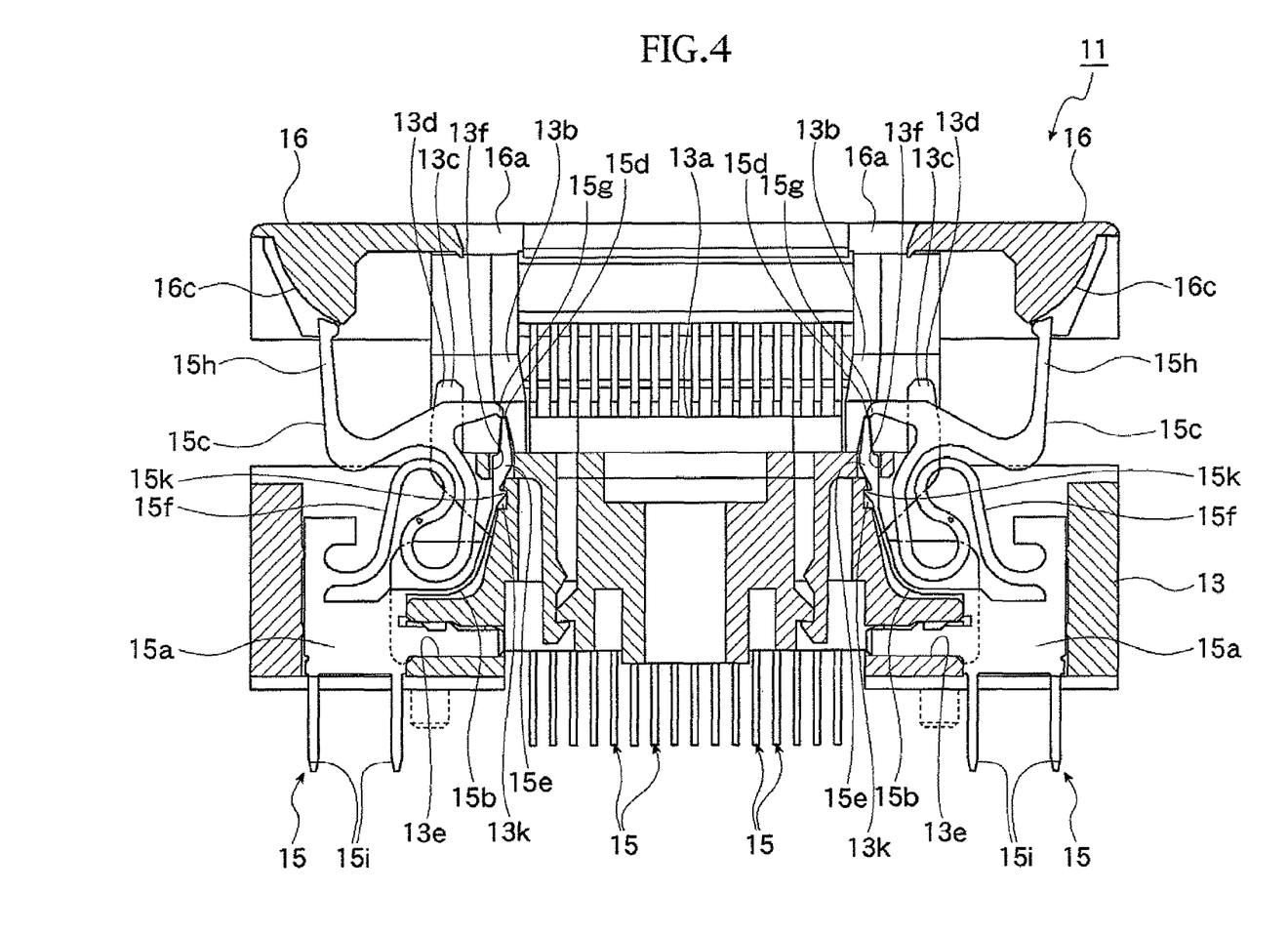
FIG. 4 is a sectional view showing the IC socket in FIG. 1 with an IC package being un-accommodated and an operation member positioned at its uppermost position.
Figure 5:
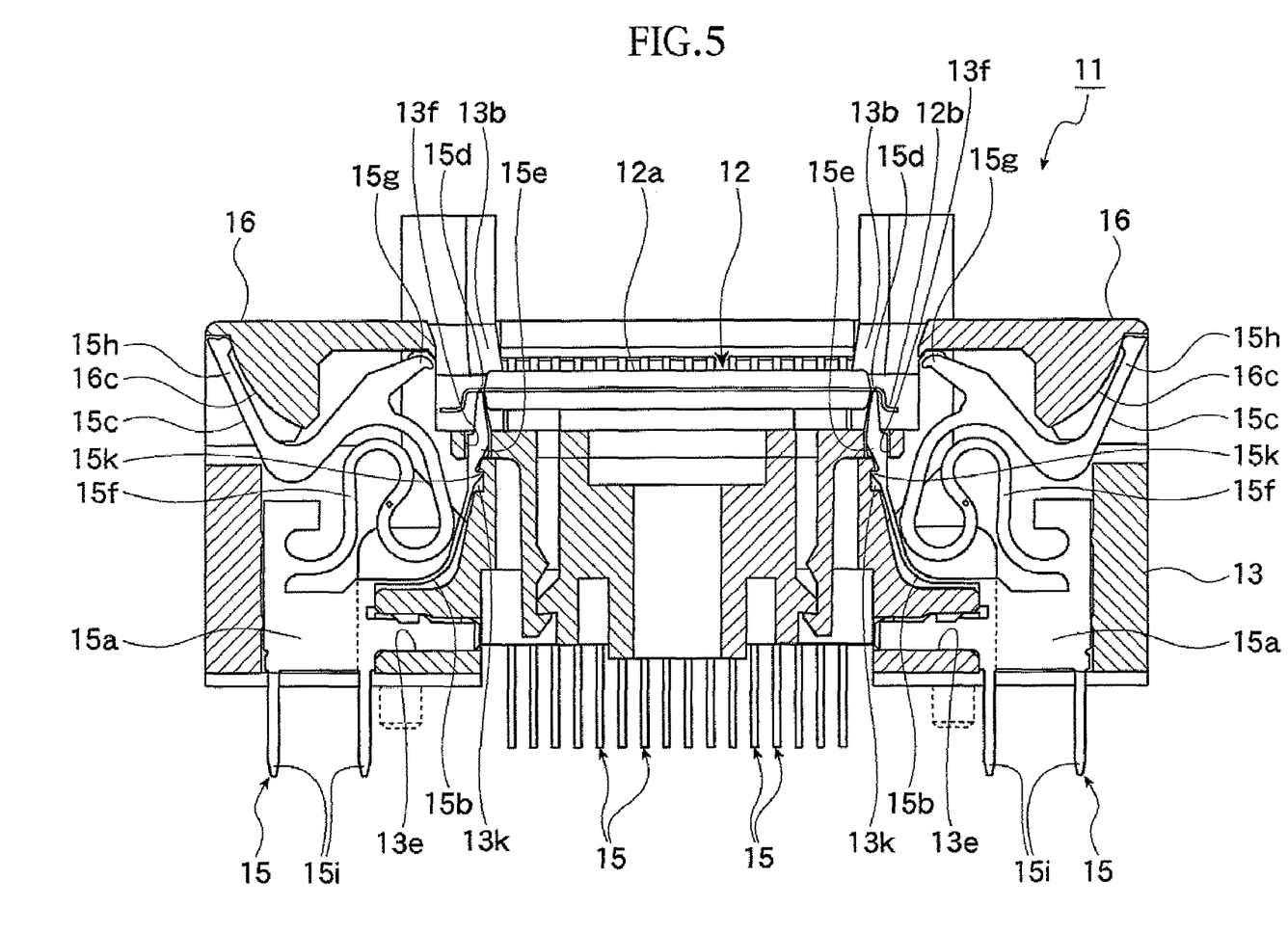
FIG. 5 is a sectional view showing the IC socket in FIG. 1 with the IC package being accommodated and the operation member positioned at its lowermost position.
Figure 6:
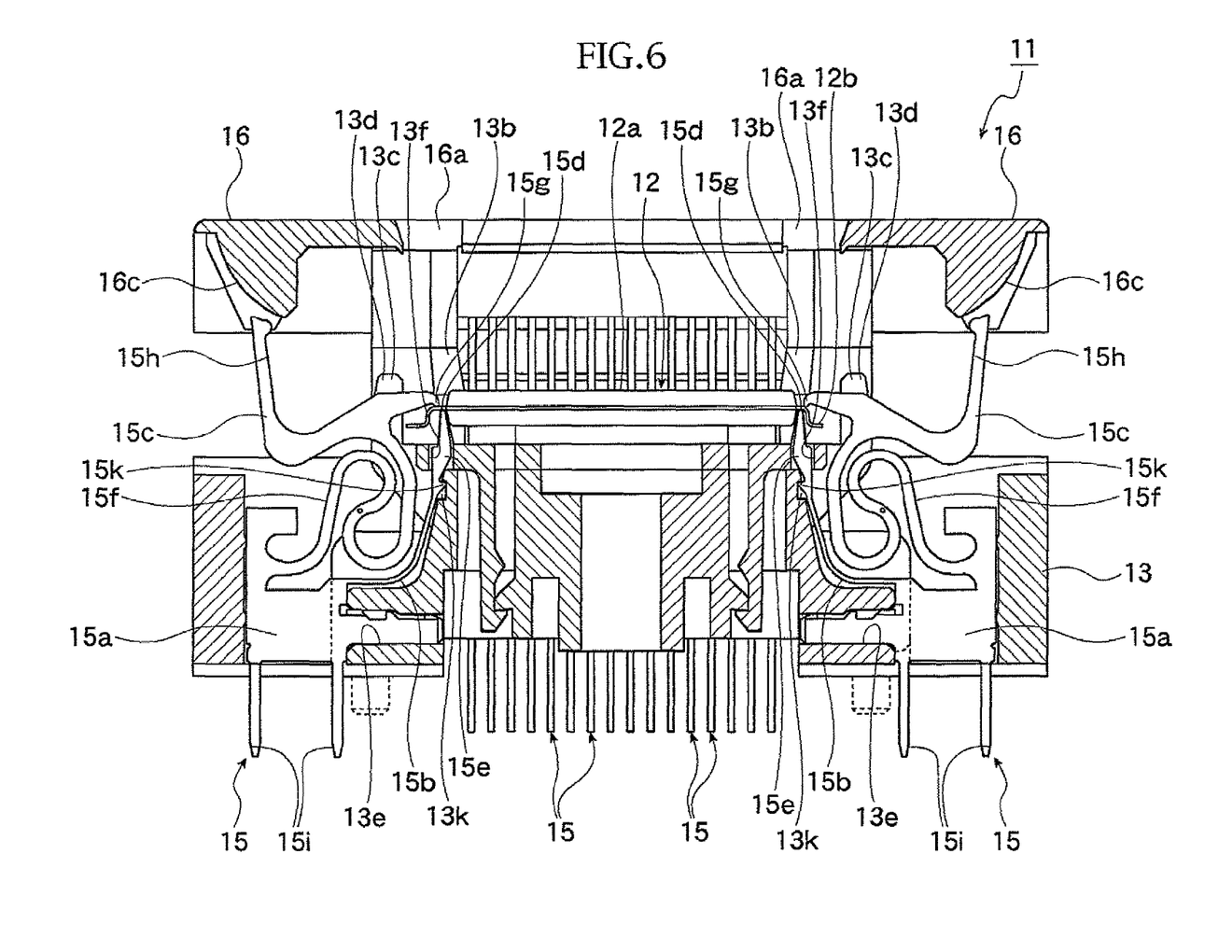
FIG. 6 is a sectional view showing the IC socket in FIG. 1 with the IC package being accommodated and the operation member positioned at its uppermost position.

On the other hand, under a situation that the IC package 12 is not accommodated and the operation member 16 is moved upward, the movable-side contact portion 15g of the movable contact piece 15c moves along an arcuate-like trajectory from an obliquely upward position to an obliquely downward position.

This movable-side contact portion 15g abuts on the upper edge portion of the fixed-side contact portion 15d and stops.

In such a socket of this kind, when the IC package 12 is accommodated, the IC package 12 can be accommodated at a predetermined position by the mold guide 13h of the socket body 13.

In addition, the mold guide 13h is provided with a plurality of slits 13j. The fixed-side contact portions 15d are inserted into and mounted on the slits 13j respectively, so that the fixed-side contact portion 15d of the contact pin 15 can be disposed at the mount portion of the mold guide 13h. Therefore when the IC package is not accommodated, the fixed-side contact portion 15d is arranged at a position corresponding to the movable-side contact portion 15g. That is, unlike a conventional socket, the movable-side contact portion 15g does not abut on the mold guide 13h, being able to prevent the mold guide 13h made of synthetic resin from being damaged. Even if the movable-side contact portion 15g abuts on the fixed-side contact portion 15g, both portions can be prevented from being damaged because both are made of metal of the same kind.

Further, as the fixed-side contact portion 15d is inserted into the slit 13j of the mold guide 13h, the mold guide 13h can guide the fixed-side contact portion 15d and also can prevent the fixed-side contact portion 15d from falling down (or toppling).

Further, since the fixed-side contact portion 15d of the contact pin 15 can be arranged at the mounting portion of the mold guide 13h, both the movable-side contact portion 15g and the fixed-side contact portion 15d can contact with the IC lead 12b of the IC package 12 in a manner of "two-point contact", able to improve the electrical connection.

Second Embodiment

FIGS. 8 to 11 represent a second embodiment of the present invention.

The second embodiment is different from the first embodiment in that the movable-side contact portion 15g of the movable contact piece 15c is structured to be positionally restricted so as not to contact the fixed-side contact portion 15d.

More specifically, the movable contact piece 15c is provided with a convex-shaped position-control portion 15j at a portion near the lower side portion of the movable-side contact portion 15g. When the movable contact piece 15c is closed by the elastic force and the electrical part is not accommodated, the position control portion 15j is structured to abut on a stopper portion 13g formed on the socket body 13 to thereby positionally control the movable-side contact portion 15g in such a way that the movable-side contact portion 15g is positioned as being apart from the upper edge portion of the fixed-side contact portion 15d by a distance (H) less than the thickness (T) of the IC lead 12b.

Figure 9:
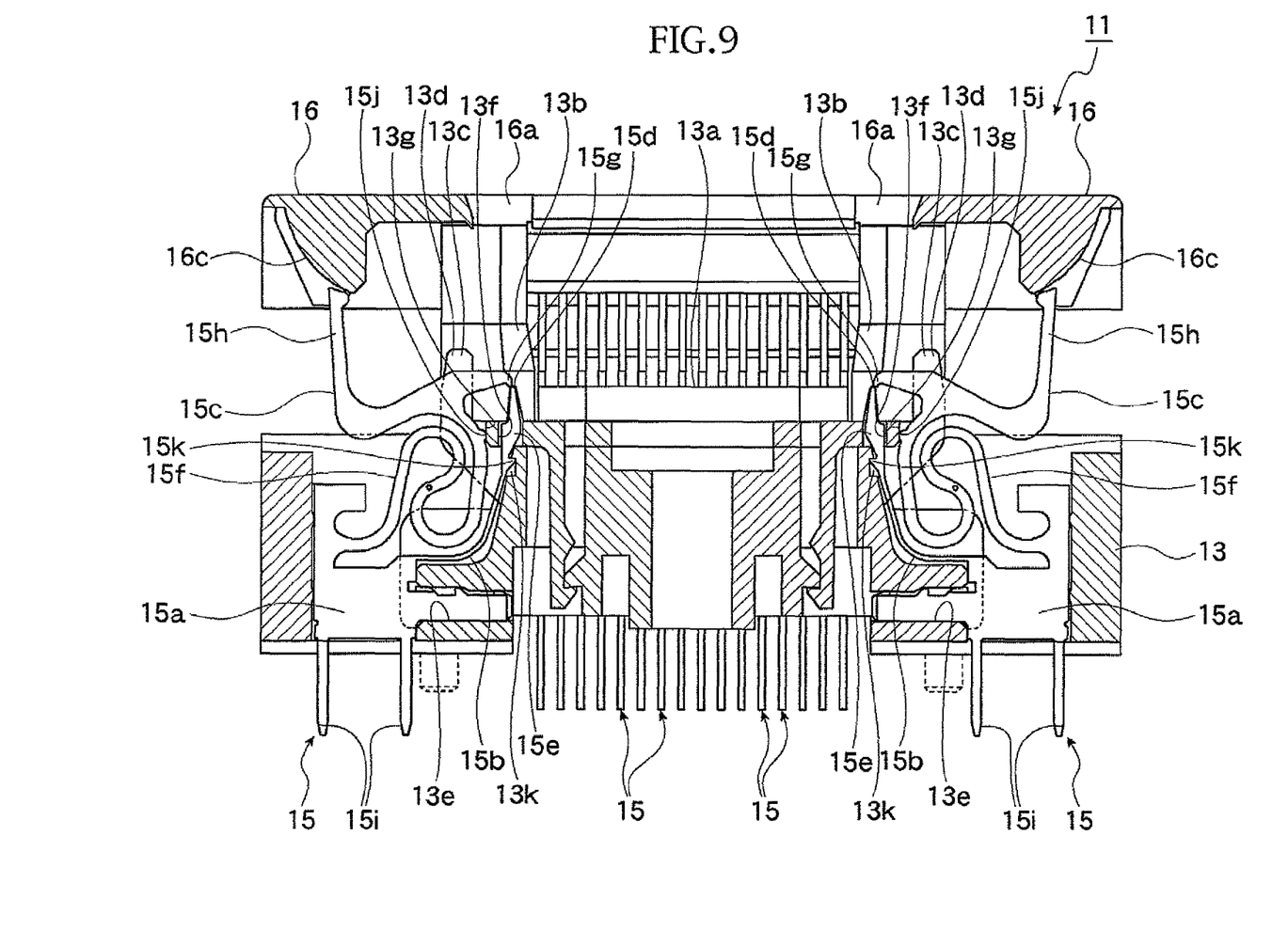
FIG. 9 is a sectional view showing the IC socket in FIG. 8 with an IC package being un-accommodated and an operation member positioned at its uppermost position in FIG. 8.

In such a socket of this kind, in a state where the IC package is not accommodated and when the operation member 16 is moved upward, the movable-side contact portion 15g of the movable contact piece 15c moves along an arcuate trajectory from an obliquely upward position to an obliquely lower position and the position control portion 15j also moves along an arcuate trajectory from an obliquely upward position to an obliquely lower position.

And when the position control portion 15j abuts on the stopper portion 13g of the socket body 13, the movement of the movable-side contact portion 15g is restricted and accordingly the movable-side contact portion 15g is positioned at a place apart from the upper edge of the fixed-side contact portion 15d by a distance (H) less than the thickness (T) of the IC lead 12b. Accordingly, the operation mentioned above prevents the end edge portion of the movable-side contact portion 15g from abutting on the upper edge portion of the fixed-side contact portion 15d and from falling down from the upper edge portion of the fixed-side contact portion 15d, eventually being able to prevent the damage to the contact pin 15. Further, the mold guide 13h does not contact the movable-side contact portion 15g so that the damage to the mold guide 13h can also be prevented.

Figure 10:
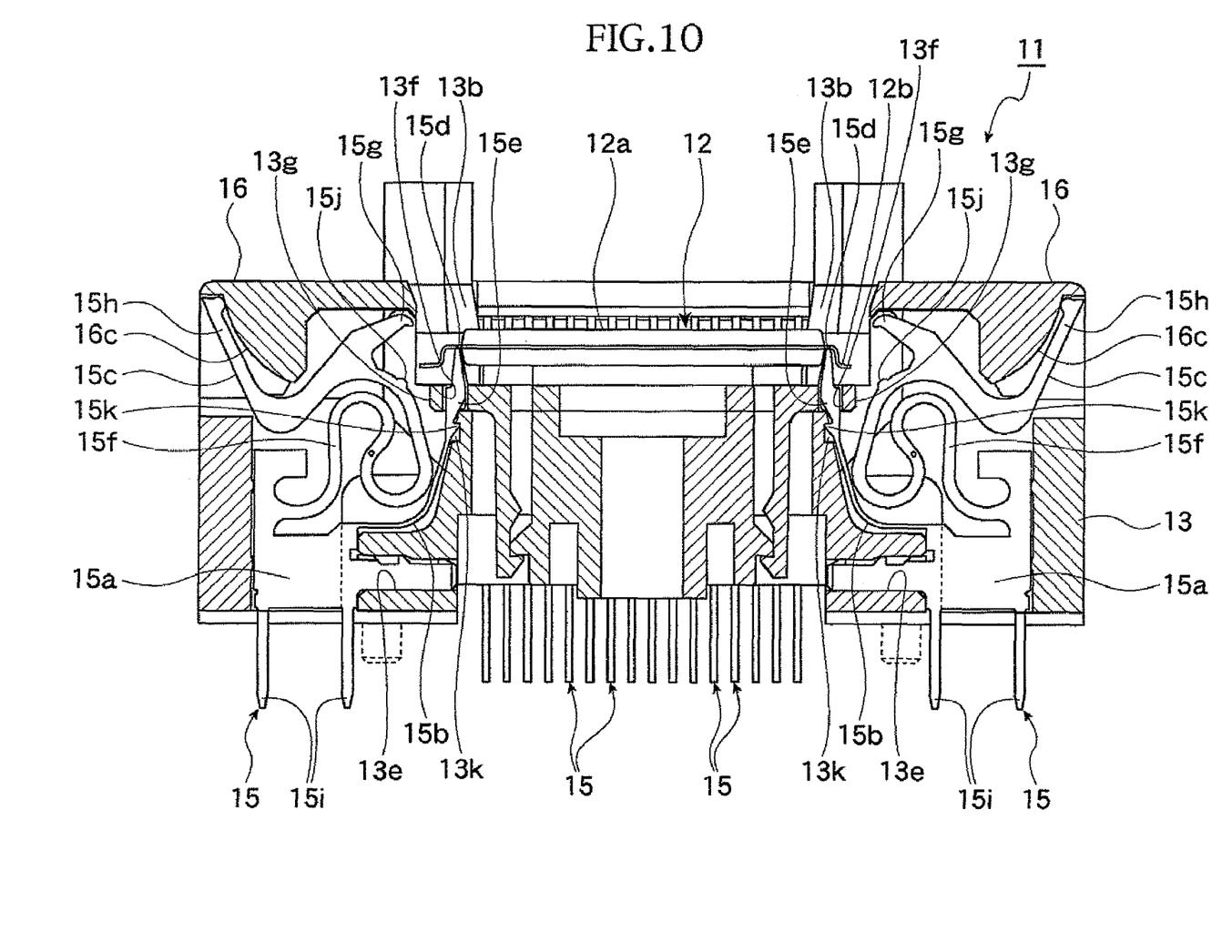
FIG. 10 is a sectional view showing the IC socket in FIG. 8 with the IC package being accommodated and the operation member positioned at its lowermost position.
Figure 11:
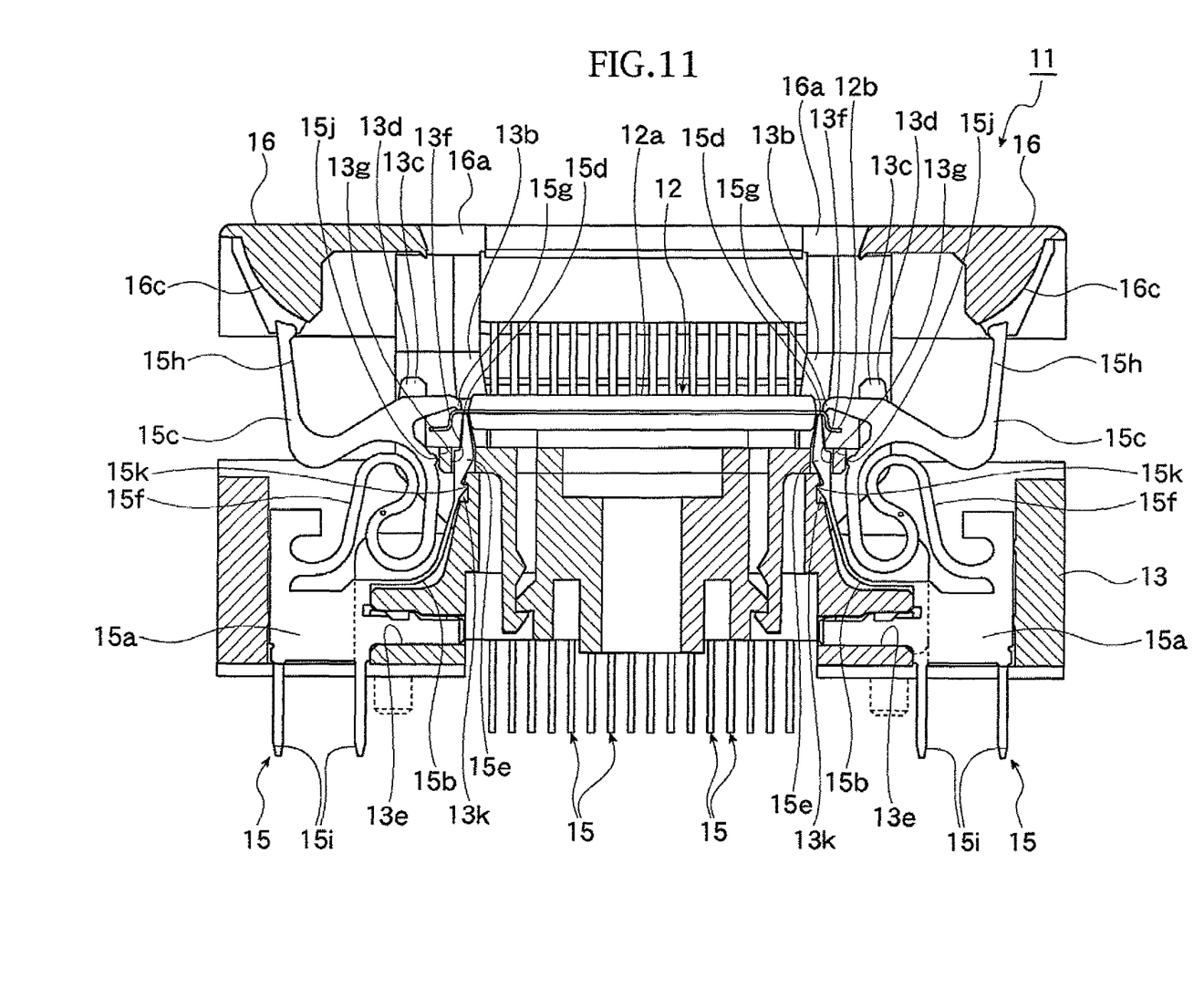
FIG. 11 is a sectional view showing the IC socket in FIG. 8 with the IC package being accommodated and the operation member positioned at its uppermost position.

The distance (H) between the movable-side contact portion 15g and the upper edge portion of the fixed-side contact portion 15d is set narrower than the thickness (T) of the IC lead 12b when the IC package 12 is not accommodated. Accordingly, when the IC package 12 is accommodated, the movable-side contact portion 15g surely contacts an upper surface of the IC lead 12b.

Other structures and functions of the second embodiment are substantially the same as those of the first embodiment, so that the explanations thereof are omitted herein.

Third Embodiment

Figure 12:
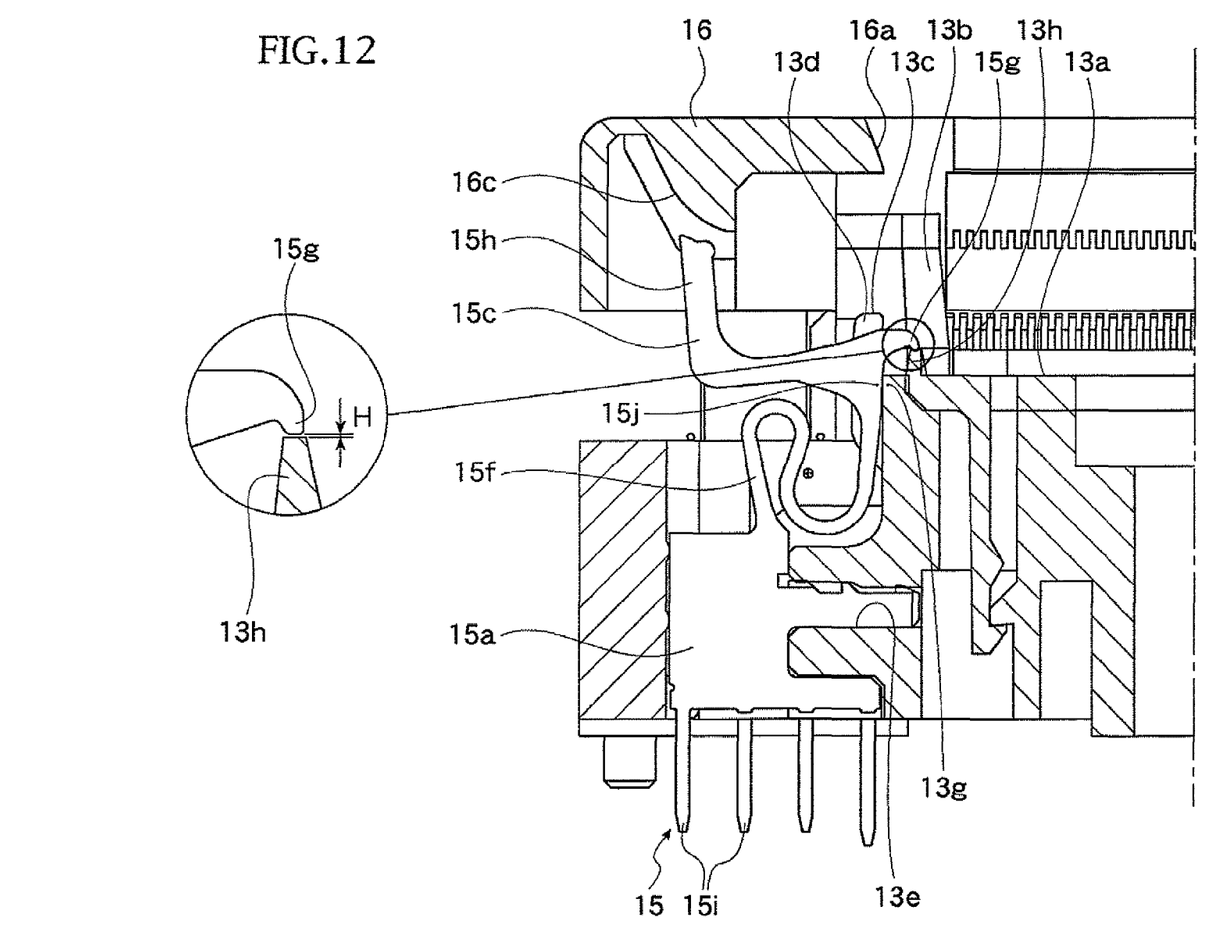
FIG. 12 is a half sectional view of an IC socket according to a third embodiment of the present invention.

FIG. 12 shows a third embodiment of the present invention.

In the second embodiment mentioned above, what is called a two-point type contact pin 15 equipped with both the fixed-contact piece 15b and the movable contact piece 15c is used. However, in the third embodiment, what is called a one-point type contact pin 15 equipped with only a movable contact piece 15c with no fixed contact piece 15b is used. As there is no fixed contact piece 15b, a slit 13j into which the fixed-side contact portion 15d of a fixed contact piece 15b is inserted is not formed at a mold guide 13h as an "electrical part guide portion". Accordingly, the mold guide is not formed into what is called a comb-like slit, but formed into a continuous type.

More specifically, the movable contact piece 15c is not provided with a convex- or mountenous-type (as shown in the second embodiment), but provided with a plain-type position control portion 15j.

Under a situation that the IC package 12 is not accommodated, the position control portion 15j is structured to abut on a stopper portion 13g of the socket body 13 to thereby positionally control the movable-side contact portion 15g of the movable contact piece 15c in such a way that the movable-side contact portion is positioned as being apart from the upper edge portion of the mold guide 13h of the socket body 13 by a distance (H) less than a thickness (T) of the IC lead 12b.

Accordingly, the movable-side contact portion 15g of the movable contact piece 15c does not abut on the upper edge portion of the mold guide 13h and the movable-side contact portion 15g does not fall or topple down from the mold guide 13*h*. Therefore, the damage of the mold guide 13*h* and of the contact pin itself can be prevented.

The structures and functions of the third embodiment other than the above different structures are substantially the same as those of the second embodiment, so that the details thereof are omitted herein.

In the embodiments of the present invention, the present invention is applied to the IC socket 11 as a "socket for electrical part". However, the present invention is not limited thereto and may be applied to another devices. In addition, in the present invention, IC package 12 having the IC lead 12*b* projecting from the four sides of the package body 12*a* is used, but other IC packages having an IC lead projecting from two sides opposite to each other can be used equally for this invention. Further, in the present embodiments, the stopper portion is provided in the socket body but it is not limited thereto. The stopper, which abuts on a position control portion, may be provided on the movable contact piece of the contact pin.

The invention claimed is:

1. A socket for an electrical part comprising:
   a socket body into which an electrical part having a terminal extending laterally is accommodated;
   a contact pin which is arranged on the socket body and provided with an elastically-deformable and movable contact piece, a movable-side contact portion which is contacted to and separated from an upper surface of the terminal of the electrical part being formed on an end edge portion of the movable contact piece, and
   a mold guide projected to form a convex shape for guiding a periphery of an electrical part body of the electrical part, wherein
   a fixed contact piece which is a counterpart to the movable contact piece is formed on the contact pin,
   a fixed-side contact portion which is designed to contact a lower-side of the electrical part terminal is formed on the fixed contact piece, and
   a plurality of slits vertically penetrating the mold guide are formed side-by-side at predetermined intervals, and the fixed-side contact portions are inserted into the slits respectively in order for an upper edge portion of the fixed-side contact portion to be faced upward.

2. The socket for an electrical part according to claim 1, wherein the upper edge portion of the fixed-side contact portion is projected higher than an upper edge portion of the mold guide.

3. The socket for an electrical part according to claim 1 or 2, wherein the terminal of the electrical part projected laterally from the electrical part body is formed into a crank shape, a portion of the terminal near the electrical part body is formed to be a shoulder portion placed one step higher than an end edge portion thereof, the movable-side contact portion is structured to contact an upper surface of the one step higher shoulder portion and the fixed-side contact portion is structured to contact a lower surface of the shoulder portion.

* * * * *